United States Patent
Fujii

(10) Patent No.: US 12,249,977 B2
(45) Date of Patent: Mar. 11, 2025

(54) INTELLIGENT POWER MODULE AND POWER MODULE

(71) Applicant: FUJI ELECTRIC CO., LTD., Kawasaki (JP)

(72) Inventor: Masanari Fujii, Matsumoto (JP)

(73) Assignee: FUJI ELECTRIC CO., LTD., Kawasaki (JP)

(\*) Notice: Subject to any disclaimer, the term of this patent is extended or adjusted under 35 U.S.C. 154(b) by 210 days.

(21) Appl. No.: 18/172,653

(22) Filed: Feb. 22, 2023

(65) Prior Publication Data

US 2023/0198516 A1 Jun. 22, 2023

Related U.S. Application Data

(63) Continuation of application No. PCT/JP2022/002614, filed on Jan. 25, 2022.

(30) Foreign Application Priority Data

Mar. 11, 2021 (JP) .................................. 2021-039425

(51) Int. Cl.
*H03K 17/08* (2006.01)
*H02H 5/04* (2006.01)
(Continued)

(52) U.S. Cl.
CPC .......... *H03K 17/082* (2013.01); *H02H 5/041* (2013.01); *H03K 5/24* (2013.01)

(58) Field of Classification Search
CPC ......... H03K 5/24; H03K 17/082; H02H 5/041
See application file for complete search history.

(56) References Cited

U.S. PATENT DOCUMENTS

2007/0216461 A1\* 9/2007 Morino .................. H03K 17/18
327/287
2012/0146782 A1\* 6/2012 Komatsu ................ H03K 17/18
340/653
(Continued)

FOREIGN PATENT DOCUMENTS

JP 2000-134990 A 5/2000
JP 2001-145338 A 5/2001
(Continued)

OTHER PUBLICATIONS

International Search Report for PCT/JP2022/002614, mailed on Mar. 29, 2022.
Written Opinion for PCT/JP2022/002614, mailed on Mar. 29, 2022.

*Primary Examiner* — Scott Bauer
(74) *Attorney, Agent, or Firm* — Rabin & Berdo, P.C.

(57) ABSTRACT

A power module, including a power element, and a control unit that controls the power element. The control unit includes: a frequency divider circuit that receives a signal for driving the power element and has a frequency dividing function, by which the frequency divider circuit generates an output having a frequency lower than that of the received signal; an overcurrent detection comparator that detects an overcurrent of the power element; an overheat protection warning comparator that outputs a warning signal upon detection of the power element having a temperature higher than a predetermined temperature; and a logic circuit that outputs an enable signal to activate the frequency dividing function of the frequency divider circuit only while the overcurrent detection comparator does not detect the overcurrent and the overheat protection warning comparator outputs the warning signal. The power module further includes an overheat protection alarm comparator that outputs an alarm signal.

7 Claims, 4 Drawing Sheets

(51) Int. Cl.
   *H03K 5/24*       (2006.01)
   *H03K 17/082*     (2006.01)

(56) References Cited

U.S. PATENT DOCUMENTS

| | | |
|---|---|---|
| 2017/0019092 A1 | 1/2017 | Taoka |
| 2020/0412355 A1* | 12/2020 | Rahman ............. H03K 17/0822 |
| 2021/0273634 A1* | 9/2021 | Djelassi-Tscheck ... H02H 5/041 |

FOREIGN PATENT DOCUMENTS

| | | | |
|---|---|---|---|
| JP | 2007-195343 | A | 8/2007 |
| JP | 2008-259309 | A | 10/2008 |
| JP | 2012-210012 | A | 10/2012 |
| WO | 2016/052011 | A1 | 4/2016 |

* cited by examiner

| OVERHEAT | OVER-CURRENT | E | OPERATION OF FREQUENCY DIVIDER CIRCUIT |
|---|---|---|---|
| A | B | C | |
| 0 | 0 | 0 | FREQUENCY DIVISION NOT PERFORMED |
| 0 | 1 | 0 | FREQUENCY DIVISION NOT PERFORMED |
| 1 | 0 | 0 | FREQUENCY DIVISION NOT PERFORMED |
| 1 | 1 | 1 | FREQUENCY DIVISION PERFORMED |

FIG. 4

INTELLIGENT POWER MODULE AND POWER MODULE

CROSS-REFERENCE TO RELATED APPLICATION

This application is a continuation application of Application International PCT/JP2022/002614 filed on Jan. 25, 2022, which designated the U.S., which claims priority to Japanese Patent Application No. 2021-039425, filed on Mar. 11, 2021, the entire contents of which are incorporated herein by reference.

BACKGROUND OF THE INVENTION

1. Field of the Invention

The embodiment discussed herein relates to an intelligent power module and a power module.

2. Background of the Related Art

In general, an inverter device that is applied to a variable-speed device for a motor or the like includes a power element that performs power conversion, a driver that drives the power element, a protection circuit, and a control circuit that integrally controls these. There is a semiconductor device called an intelligent power module that is formed by incorporating the power element, driver, and protection circuit other than the control circuit among the above components into one package, or a power module that is formed by incorporating the power element and driver into one package.

As the power element, a voltage-controlled semiconductor element such as an insulated gate bipolar transistor (IGBT) or a metal-oxide semiconductor field-effect transistor (MOSFET) is used.

The intelligent power module includes, as protection circuits for protecting the power element, an overheat protection circuit for the overheat protection of the power element, an overcurrent protection circuit for the overcurrent protection of the power element, and other circuits.

The overheat protection circuit monitors the temperature of the power element, and when the monitored temperature reaches a predetermined temperature, outputs a warning signal. Then, when the power element continues operating and therefore the monitored temperature increases close to an element breakdown temperature, the overheat protection circuit outputs an alarm signal to stop the switching operation of the power element.

The overcurrent protection circuit monitors a current flowing through the power element, and when detecting that an overcurrent greater than or equal to a predetermined value flows through the power element, outputs an overcurrent detection signal to reduce the drive capability of the power element.

The overheat protection circuit outputs the warning signal when the temperature of the power element rises to the predetermined temperature, and then when the power element continues operating and therefore the temperature of the power element further rises, outputs the alarm signal to stop the switching operation of the power element. However, the temperature rise of the power element up to the point where the alarm signal is output leads to a reduction in the reliability and lifetime of the power element. To avoid this, the following measure is taken: when the warning signal is output, the switching operating frequency of the power element is reduced, thereby suppressing the temperature rise of the power element (see, for example, Japanese Laid-open Patent Publications No. 2007-195343, No. 2012-210012, and No. 2000-134990).

In the case where an overcurrent caused by an overload or the like is detected, it is effective to reduce the switching operating frequency of the power element, in order to suppress the temperature rise of the power element. The reduction in the operating frequency at the time of temperature warning increases the period, which lengthens the duration of the current peak. If the current is interrupted at the time of overheat alarm during the current peak, the power element may be damaged by a surge voltage. On the other hand, even when the temperature rises due to an increase in the ambient temperature or a removal of a heatsink, the operating frequency is reduced at the time of temperature warning. Therefore, if the current is interrupted at the time of overheat alarm, there is a possibility that the power element is damaged by a surge voltage.

SUMMARY OF THE INVENTION

According to one aspect, there is provided an intelligent power module including: a power element; and a control unit configured to control the power element, the control unit including a frequency divider circuit configured to receive a signal for driving the power element, the frequency divider circuit having a frequency dividing function, by which the frequency divider circuit generate an output having a frequency lower than that of the received signal, an overcurrent detection comparator that detects an overcurrent of the power element, an overheat protection warning comparator that outputs a warning signal upon detection of the power element having a temperature higher than a first predetermined temperature, an overheat protection alarm comparator that outputs an alarm signal upon detection of the power element having the temperature reaching a second predetermined temperature, the second predetermined temperature being higher than the first predetermined temperature, and a logic circuit that outputs an enable signal to activate the frequency dividing function of the frequency divider circuit only while the overcurrent detection comparator does not detect the overcurrent and the overheat protection warning comparator outputs the warning signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 illustrates a truth table describing the operation of an AND circuit in a logic circuit.

DETAILED DESCRIPTION OF THE INVENTION

Hereinafter, an embodiment will be described with reference to the accompanying drawings.

Figure 1:
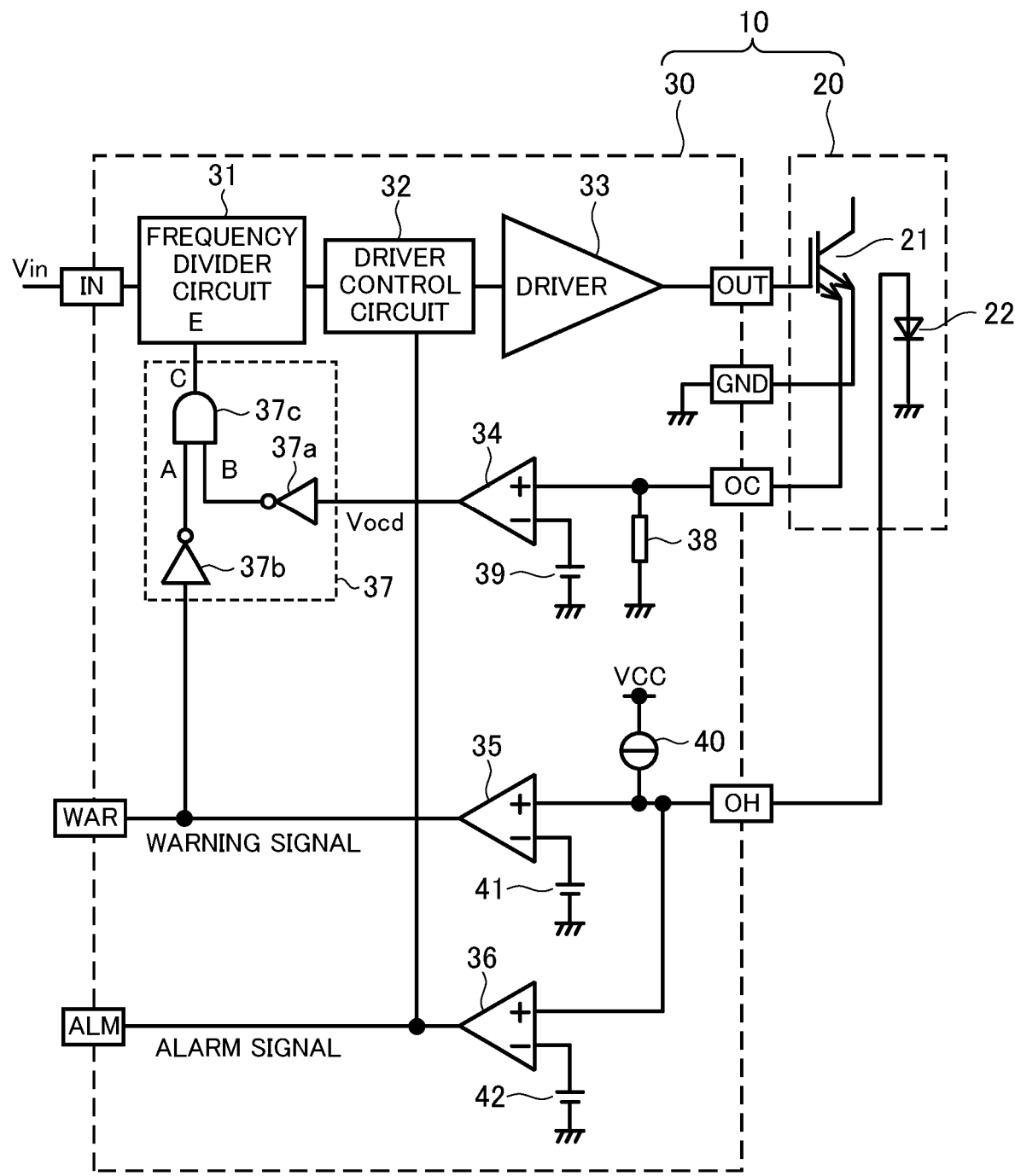
FIG. 1 illustrates an example of the configuration of an intelligent power module according to an embodiment.
Figure 2:
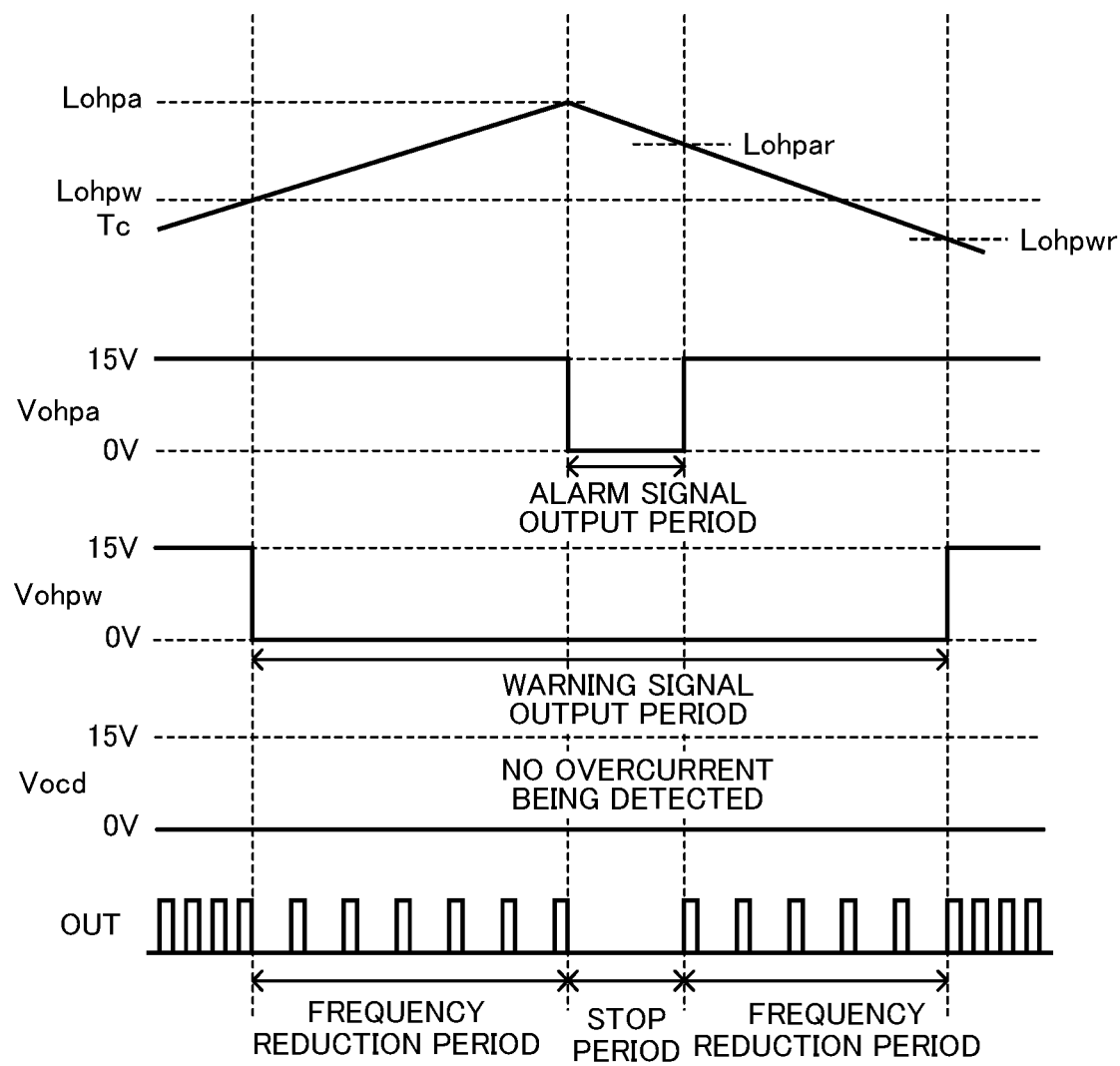
FIG. 2 illustrates the operation of the intelligent power module when no overcurrent flows.
Figure 3:
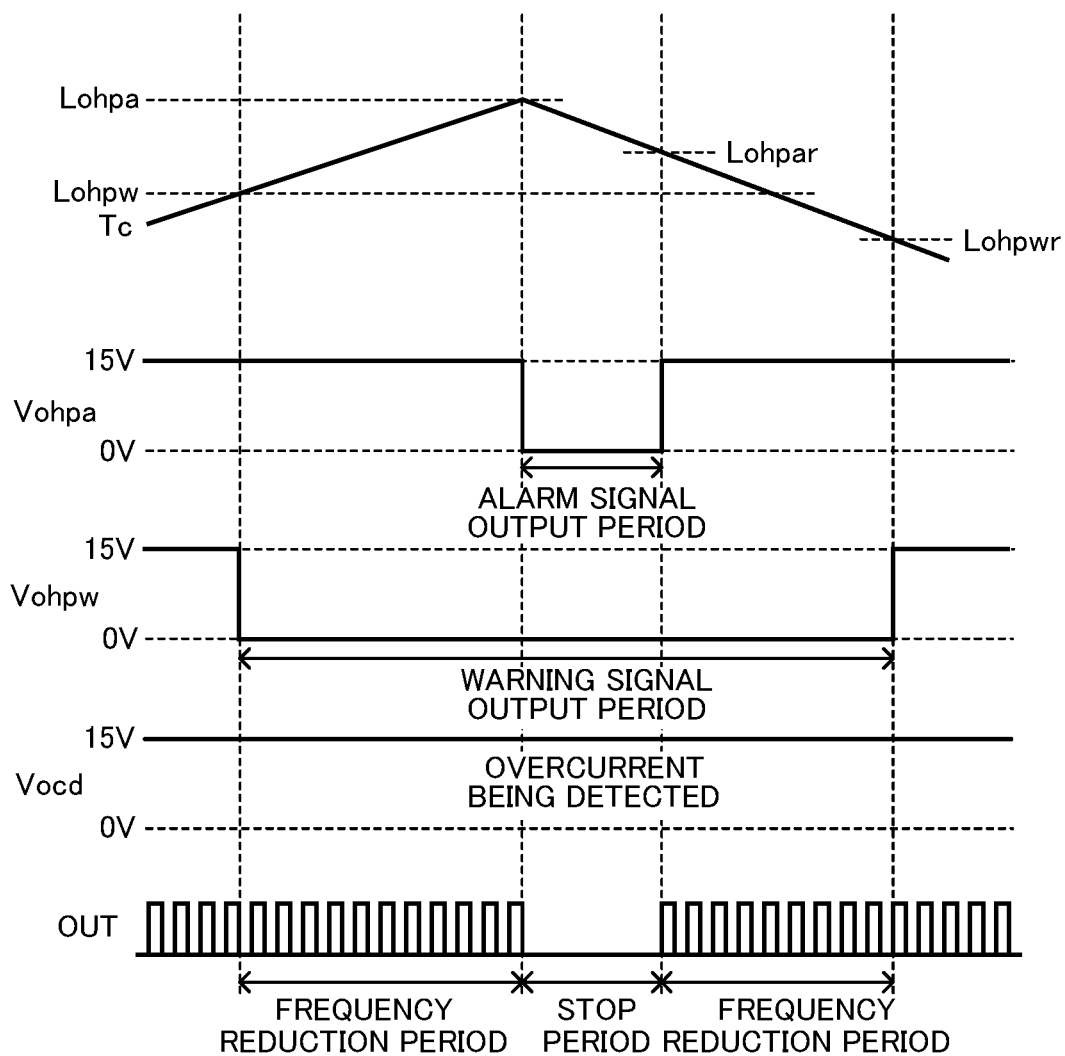
FIG. 3 illustrates the operation of the intelligent power module when an overcurrent flows.

FIG. 1 illustrates example of the configuration of an intelligent power module according to an embodiment. FIG. 2 illustrates the operation of the intelligent power module when no overcurrent flows. FIG. 3 illustrates the operation of the intelligent power module when an overcurrent flows. FIG. 4 illustrates a truth table describing the operation of an AND circuit in a logic circuit. In this connection, FIGS. 2 and 3 represent, from the top, a chip temperature, an alarm signal for overheat protection, a warning signal for overheat protection, an output signal of an overcurrent detection comparator, and an output signal of a driver.

As illustrated in FIG. 1, the intelligent power module 10 according to the present embodiment includes a power element 20 that performs power conversion and a control integrated circuit (IC) 30 serving as a control unit that drives and protects the power element 20.

The power element 20 includes an insulated gate bipolar transistor (IGBT) 21 and a temperature detection diode 22. The power element 20 includes a free wheeling diode (FWD) connected in inverse-parallel to the IGBT 21, although this is not illustrated. The IGBT 21 includes a sense IGBT that is able to extract a current proportional to a main current (collector current). The temperature detection diode 22 is integrally formed with the chip of the IGBT 21.

The control IC 30 includes a frequency divider circuit 31, a driver control circuit 32, a driver 33, an overcurrent detection comparator 34, an overheat protection warning comparator 35, an overheat protection alarm comparator 36, and a logic circuit 37.

The frequency divider circuit 31 has an input terminal connected to an IN terminal of the control IC 30. The IN terminal is connected to a higher-level control circuit and receives an input signal Vin that controls the switching of the power element 20. The frequency divider circuit 31 has an enable input terminal E that activates the frequency dividing function. The output terminal of the frequency divider circuit 31 is connected to the input terminal of the driver control circuit 32. The output terminal of the driver control circuit 32 is connected to the input terminal of the driver 33. The output terminal of the driver 33 is connected to the gate of the IGBT 21 of the power element 20 via an OUT terminal of the control IC 30. The emitter of the IGBT 21 is connected to the ground via a GND terminal of the control IC 30.

The overcurrent detection comparator 34 has a non-inverting input terminal, an inverting input terminal, and an output terminal. The non-inverting input terminal of the overcurrent detection comparator 34 is connected to one terminal of a sense resistor 38. The other terminal of the sense resistor 38 is connected to the ground. The non-inverting input terminal of the overcurrent detection comparator 34 is also connected to the sense emitter of the IGBT 21 via an OC terminal of the control IC 30. The inverting input terminal of the overcurrent detection comparator 34 is connected to the positive electrode terminal of a reference voltage source 39. The negative electrode terminal of the reference voltage source 39 is connected to the ground. This reference voltage source 39 outputs reference voltage that corresponds to a threshold voltage for detecting an overcurrent. The output terminal of the overcurrent detection comparator 34 is connected to the logic circuit 37.

The overheat protection warning comparator 35 and overheat protection alarm comparator 36 each have a non-inverting input terminal, an inverting input terminal, and an output terminal. The non-inverting input terminals of the overheat protection warning comparator 35 and overheat protection alarm comparator 36 are connected to the current output terminal of a constant current source 40. The current input terminal of the constant current source 40 is connected to a VCC line of a power supply for the control IC 30. The non-inverting input terminals of the overheat protection warning comparator 35 and overheat protection alarm comparator 36 are also connected to the anode of the temperature detection diode 22 of the power element 20 via an OH terminal of the control IC 30. The cathode of the temperature detection diode 22 is connected to the ground.

The inverting input terminal of the overheat protection warning comparator 35 is connected to the positive electrode terminal of a reference voltage source 41, and the negative electrode terminal of the reference voltage source 41 is connected to the ground. This reference voltage source 41 outputs a reference voltage that corresponds to a threshold voltage for detecting an overheat protection warning. In this connection, this overheat protection warning comparator 35 is a hysteresis comparator that switches between two thresholds according to the logic state of the output. Therefore, the reference voltage source 41 has a voltage of an overheat protection warning level and a voltage of an overheat protection warning reset level. The output terminal of the overheat protection warning comparator 35 is connected to a WAR terminal of the control IC 30 and the logic circuit 37.

The inverting input terminal of the overheat protection alarm comparator 36 is connected to the positive electrode terminal of a reference voltage source 42. The negative electrode terminal of the reference voltage source 42 is connected to the ground. This reference voltage source 42 outputs a reference voltage that corresponds to a threshold voltage for detecting an overheat protection alarm. The reference voltage of the reference voltage source 42 is lower than the reference voltage of the reference voltage source 41 for warning detection. In this connection, this overheat protection alarm comparator 36 is a hysteresis comparator that switches between two thresholds according to the logic state of the output. Therefore, the reference voltage source 42 has a voltage of an overheat protection alarm level and a voltage of an overheat protection alarm reset level. The output terminal of the overheat protection alarm comparator 36 is connected to an ALM terminal of the control IC 30 and the driver control circuit 32.

The logic circuit 37 includes inverter circuits 37a and 37b and an AND circuit 37c. The input terminal of the inverter circuit 37a is connected to the output terminal of the overcurrent detection comparator 34, and the output terminal of the inverter circuit 37a is connected to one input terminal of the AND circuit 37c. The input terminal of the inverter circuit 37b is connected to the output terminal of the overheat protection warning comparator 35, and the output terminal of the inverter circuit 37b is connected to the other input terminal of the AND circuit 37c. The output terminal of the AND circuit 37c is connected to the enable input terminal E of the frequency divider circuit 31.

In this intelligent power module 10, when an input signal Vin that controls the switching of the power element 20 is supplied from the higher-level control circuit, the frequency divider circuit 31 outputs the input signal Vin as it is to the driver control circuit 32 during the normal operation, without dividing the frequency of the input signal Vin. When an enable signal is input from the logic circuit 37 to the enable input terminal E of the frequency divider circuit 31, the frequency divider circuit 31 divides the frequency of the input signal Vin to reduce the operating frequency of the power element 20 and sends the frequency-divided output signal to the driver control circuit 32. The driver control circuit 32 sends the signal received from the frequency divider circuit 31 to the driver 33, and the driver 33 then drives the IGBT 21 using the signal of the operating frequency output from the frequency divider circuit 31. The driver control circuit 32 also receives an alarm signal from the overheat protection alarm comparator 36 and exercises control to, among others, stop the operation of the power element 20.

When the IGBT 21 starts to operate, a collector current flows, and a sense current proportional to the collector current is output from the sense emitter of the sense IGBT. The sense current is input to the control IC 30 via the OC terminal and flows through the sense resistor 38 to the ground. At this time, a sense voltage proportional to the sense current is generated between both ends of the sense resistor 38, and the sense voltage is supplied as a signal having a value proportional to the collector current of the IGBT 21 to the non-inverting input terminal of the overcurrent detection comparator 34. The overcurrent detection comparator 34 compares the sense voltage with the reference voltage of the reference voltage source 39 and outputs the comparison result as an output signal Vocd. This output signal Vocd is a logic signal with a low level of "0" if the sense voltage is lower than the reference voltage. The output signal Vocd is a logic signal with a high level of "1" if the sense voltage is higher than or equal to the reference voltage.

The temperature of the IGBT 21 is detected by the temperature detection diode 22. More specifically, a constant current is supplied from the constant current source 40 via the OH terminal to the temperature detection diode 22. Thereby, a forward voltage of the temperature detection diode 22 appears at the OH terminal. The forward voltage of the temperature detection diode 22 decreases as the temperature increases. Therefore, it is possible to estimate the chip temperature of the IGBT 21 on the basis of the value of the forward voltage. The voltage at the OH terminal is supplied to the non-inverting input terminals of the overheat protection warning comparator 35 and overheat protection alarm comparator 36.

The overheat protection warning comparator 35 compares the voltage at the OH terminal with the reference voltage of the reference voltage source 41, and supplies the comparison result to the higher-level control circuit via the WAR terminal. The overheat protection warning comparator 35 outputs a logic signal with a high level of "1" if the voltage at the OH terminal is higher than the reference voltage, and a logic signal with a low level of "0" as a warning signal if the voltage at the OH terminal is lower than or equal to the reference voltage. More specifically, since the overheat protection warning comparator 35 is a hysteresis comparator, the reference voltage of the reference voltage source 41 has an overheat protection warning level Lohpw and an overheat protection warning reset level Lohpwr. Therefore, the overheat protection warning comparator 35 outputs a signal with a high level of "1" when the chip temperature Tc of the IGBT 21 is room temperature. When the chip temperature Tc of the IGBT 21 rises from the room temperature to the overheat protection warning level Lohpw or higher, the overheat protection warning comparator 35 outputs a warning signal with a low level of "0". The overheat protection warning comparator 35 outputs a signal with a high level of "1" when the chip temperature Tc of the IGBT 21 falls from the overheat protection warning level Lohpw to the overheat protection warning reset level Lohpwr or lower.

The overheat protection alarm comparator 36 compares the voltage at the OH terminal with the reference voltage of the reference voltage source 42, and supplies the comparison result to the higher-level control circuit via the ALM terminal. The overheat protection alarm comparator 36 outputs a logic signal with a high level of "1" if the voltage at the OH terminal is higher than the reference voltage, and a logic signal with a low level of "0" as an alarm signal if the voltage at the OH terminal is lower than or equal to the reference voltage. More specifically, since the overheat protection alarm comparator 36 is a hysteresis comparator, the reference voltage of the reference voltage source 42 has an overheat protection alarm level Lohpa and an overheat protection alarm reset level Lohpar, as illustrated in FIGS. 2 and 3. Therefore, the overheat protection alarm comparator 36 outputs a logic signal with a high level of "1" until the chip temperature Tc of the IGBT 21 reaches the overheat protection alarm level Lohpa that is higher than the overheat protection warning level Lohpw. The overheat protection alarm comparator 36 outputs an alarm signal with a low level of "0" when the chip temperature Tc of the IBGT 21 reaches the overheat protection alarm level Lohpa. The overheat protection alarm comparator 36 outputs a signal with a high level of "1" when the chip temperature Tc of the IGBT 21 falls below the overheat protection alarm reset level Lohpar that is higher than the overheat protection warning reset level Lohpwr.

In the logic circuit 37, the AND circuit 37c receives, at its one input terminal, a signal B generated by logically inverting the output signal Vocd of the overcurrent detection comparator 34 by the inverter circuit 37a, and also receives, at the other input terminal, a signal A generated by logically inverting a warning signal by the inverter circuit 37b. Therefore, as illustrated in FIG. 4, an output signal C of the AND circuit 37c has a high level of "1" only when the following conditions are satisfied: an overheat current is not detected and therefore the signal B has a high level of "1," and a warning signal is output and therefore the signal A has a high level of "1." When an enable signal with a high level of "1" is input to the enable input terminal E of the frequency divider circuit 31, the frequency divider circuit 31 activates its frequency dividing function.

That is, the frequency divider circuit 31 divides the frequency of the input signal Vin to reduce the operating frequency while an overcurrent is not detected and a warning signal is output, as illustrated in FIG. 2. When an overcurrent is detected and a warning signal is output, the frequency dividing function of the frequency divider circuit 31 is deactivated so as not to reduce the operating frequency, as illustrated in FIG. 3.

In the case where the output of a warning signal is due to an increase in the ambient temperature of the IGBT 21 or a removal of a heatsink, the operating frequency is not reduced, which avoids a risk of damage due to a surge voltage that is generated when the temperature further increases and an output of an alarm signal causes the IGBT 21 to interrupt the current.

In the above embodiment, the logic circuit 37 is formed of the inverter circuits 37a and 37b and the AND circuit 37c. In place of these, the logic circuit 37 may be formed of a NOR circuit. The NOR circuit outputs a logic signal with a high level only when receiving both a low-level logic signal that is output when an overcurrent is not detected and a low-level logic signal that is output when a warning signal is output.

In addition, the above embodiment relates to an intelligent power module with a protection circuit that outputs an alarm signal. Alternatively, the present disclosure is applicable to a power module without such a protection circuit.

The intelligent power module configured as described above does not reduce the operating frequency while a warning signal is output but an overcurrent is detected. This makes it possible to avoid a risk of damage due to a surge voltage when an alarm signal is output and the power element interrupts the current.

All examples and conditional language provided herein are intended e pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An intelligent power module, comprising:
   a power element; and
   a control unit configured to control the power element, the control unit including
      a frequency divider circuit configured to receive a signal for driving the power element, the frequency divider circuit having a frequency dividing function, by which the frequency divider circuit generate an output having a frequency lower than that of the received signal,
      an overcurrent detection comparator that detects an overcurrent of the power element,
      an overheat protection warning comparator that outputs a warning signal upon detection of the power element having a temperature higher than a first predetermined temperature,
      an overheat protection alarm comparator that outputs an alarm signal upon detection of the power element having the temperature reaching a second predetermined temperature, the second predetermined temperature being higher than the first predetermined temperature, and
      a logic circuit that outputs an enable signal to activate the frequency dividing function of the frequency divider circuit only while the overcurrent detection comparator does not detect the overcurrent and the overheat protection warning comparator outputs the warning signal.

2. The intelligent power module according to claim 1, wherein
   the overcurrent detection comparator outputs a first low-level logic signal while the overcurrent detection comparator does not detect the overcurrent, and
   the overheat protection warning comparator outputs a second low-level logic signal as the warning signal.

3. The intelligent power module according to claim 2, wherein the logic circuit includes
   a first inverter circuit that logically inverts the first low-level logic signal output from the overcurrent detection comparator,
   a second inverter circuit that logically inverts the warning signal output from the overheat protection warning comparator, and
   an AND circuit that receives, as inputs thereof, an output of the first inverter circuit and an output of the second inverter circuit.

4. The intelligent power module according to claim 1, wherein
   the power element includes a temperature detection diode, and
   the temperature of the power element is detected by the temperature detection diode.

5. The intelligent power module according to claim 1, wherein the power element is an insulated gate bipolar transistor (IGBT).

6. The intelligent power module according to claim 5, wherein
   the power element includes a sense IGBT configured to output a sense current, and
   the overcurrent of the power element is detected by comparing a sense voltage proportional to the sense current with a reference voltage.

7. A power module, comprising:
   a power element; and
   a control unit configured to control the power element, the control unit including
      a frequency divider circuit configured to receive a signal for driving the power element, the frequency divider circuit having a frequency dividing function, by which the frequency divider circuit generates an output having a frequency lower than that of the received signal,
      an overcurrent detection comparator that detects an overcurrent of the power element,
      an overheat protection warning comparator that outputs a warning signal upon detection of the power element having a temperature higher than a predetermined temperature, and
      a logic circuit that outputs an enable signal to activate the frequency dividing function of the frequency divider circuit only while the overcurrent detection comparator does not detect the overcurrent and the overheat protection warning comparator outputs the warning signal.

* * * * *